US005792999A

United States Patent [19]

Arnold et al.

[11] Patent Number: 5,792,999

[45] Date of Patent: Aug. 11, 1998

[54] NOISE ATTENUATING IN PORTED ENCLOSURE

[75] Inventors: Finn Arnold, Sutton; Stephen R. O'Dea, Wilmington, both of Mass.

[73] Assignee: Bose Corporation, Framingham, Mass.

[21] Appl. No.: 788,906

[22] Filed: Jan. 23, 1997

[51] Int. Cl.$^6$ .............................. G10K 3/02; H05K 5/00; F01N 7/00

[52] U.S. Cl. .......................... 181/141; 181/145; 181/156; 181/199; 181/225

[58] Field of Search .................................... 181/141, 144, 181/145, 147, 148, 155, 156, 199, 224, 225; 381/87, 88, 90, 153, 159

[56] References Cited

U.S. PATENT DOCUMENTS

| | | | |
|---|---|---|---|
| 3,778,551 | 12/1973 | Grodinsky | 381/90 |
| 4,201,274 | 5/1980 | Carlton | 181/156 |
| 4,210,778 | 7/1980 | Sakurai et al. | 181/156 |
| 4,549,631 | 10/1985 | Bose | 181/155 |
| 4,624,338 | 11/1986 | Ewald | 181/148 |
| 4,811,403 | 3/1989 | Henricksen et al. | 181/152 |
| 4,843,624 | 6/1989 | Rashak | 381/91 |
| 5,092,424 | 3/1992 | Schreiber et al. | 181/145 |
| 5,340,275 | 8/1994 | Eisinger | 181/224 |
| 5,426,707 | 6/1995 | Wijnker | 381/194 |
| 5,446,793 | 8/1995 | Piccaluga et al. | 181/199 |
| 5,508,477 | 4/1996 | Kato et al. | 181/205 |
| 5,547,272 | 8/1996 | Paterson et al. | 312/232.2 |

*Primary Examiner*—Eddie C. Lee

*Attorney, Agent, or Firm*—Fish & Richardson P.C.

[57] ABSTRACT

Noise attenuation apparatus comprising an enclosure having a wall separating an interior and an exterior. The enclosure defines a volume. The volume is characterized by an acoustic compliance and includes a device producing noise. The noise has spectral components predominantly in a noise frequency range. A first port has a first acoustic mass. The port passes through the wall between the interior and the exterior wherein the acoustic compliance and the first acoustic mass are configured to establish a resonant frequency outside the noise frequency range.

15 Claims, 3 Drawing Sheets

NOISE ATTENUATING IN PORTED ENCLOSURE

The invention relates to noise attenuation and heat dissipation in electronic systems, and more specifically to the use of ported enclosures to attenuate fan noise in an electronic device, such as a multimedia computer system and still more specifically to the use of a ported loudspeaker system for attenuating fan noise, dissipating heat and reproducing sound.

For background, reference is made to U.S. Pat. Nos. 4,549,631 and 5,092,424.

It is an important object of the invention to provide improved noise attenuating and heat dissipating.

According to the invention, noise attenuation apparatus includes an enclosure having a wall separating an interior and an exterior. The enclosure defines a volume, characterized by an acoustic compliance. A noise producing device is disposed in the interior of the enclosure. The noise produced by the device has a predominant noise frequency range. The apparatus has a first port having a first length and a first cross sectional area which represent a first acoustic mass. The acoustic compliance and the acoustic mass are configured to establish a resonant frequency which lies outside the predominant frequency range of the noise.

In another aspect of the invention, a loudspeaker apparatus includes an enclosure, defined by a wall. The enclosure encloses a volume of air. First and second ports having first and second acoustic masses, respectively, protrude the wall. An electroacoustical transducer is mounted in the wall. A heat producing device is disposed in the enclosure. An airflow directing device directs a cooling airflow in the first port, across the heat producing device, and out the second port. According to a feature of the invention, the resonant frequency also helps establish a desired acoustical frequency response.

Other features, objects and advantages will become apparent from the following detailed description, which refers to the following drawings in which.

Figure 1:
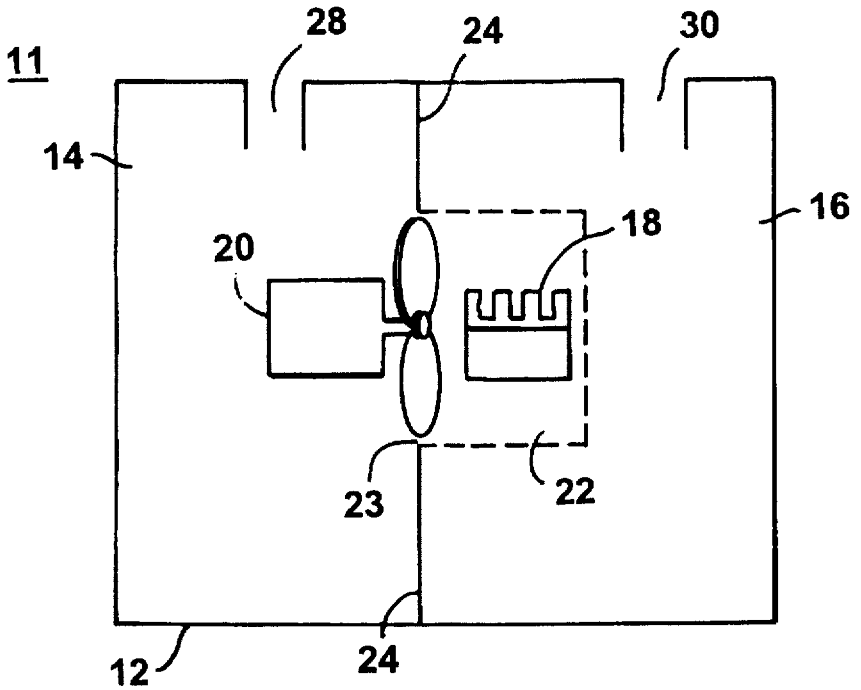
FIG. 1 is a diagrammatic view of a first embodiment of the invention.

With reference now to the drawings and more particularly FIG. 1, there is shown an apparatus according to the invention. A noise reduction system 11 includes an enclosure 12 that has first and second subchambers 14 and 16 respectively, separated by baffle 24. Subchambers 14, 16 each may have in an exterior wall a port (28 and 30 respectively). A heat producing device 18 is in second subchamber 16. Heat producing device 18 may be enclosed in an optional vented enclosure 22. A fan 20 is mounted in an opening 23 in baffle 24, positioned such that it can cause cooling air to flow in one port, across heat producing device 18, and out the other port.

The acoustic characteristics of the enclosure 12 may be controlled by adjusting parameters such as the volumes of the two subchambers 14, 16, and the length, cross-sectional area, and the number of the ports 28 and 30. Appropriate values for the parameters can result in the volume of air in subchambers 14, 16 to resonate with the acoustic mass in ports 28, 30 at frequencies lower than the predominant frequency spectra of the fan noise. Effectively, the noise reduction system 11 acts as a filter that attenuates the noise. Thus ports 28, 30 allow direct current airflow to pass freely, while significantly attenuating the noise produced by the fan. The noise attenuation aspects of the embodiment of FIG. 1 can also be implemented without the heat producing device and fan, and with other noise producing devices. In these situations, baffle 24 need not be included and ports 28, 30 can be replaced with a single port having an acoustic mass equivalent to the combined acoustic masses of ports 28, 30.

Figure 2:
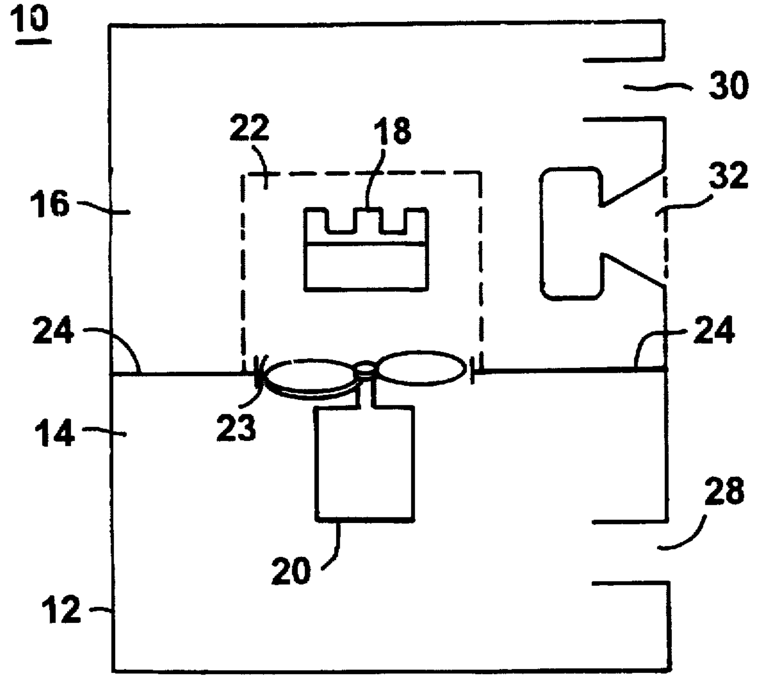
FIG. 2 is a diagrammatic view of a second embodiment of the invention.

Referring to FIG. 2, there is shown another embodiment of the invention. A loudspeaker system 10 includes the elements of FIG. 1, and in addition, there is an electroacoustical transducer 32 mounted in a wall of enclosure 12. Opening 23 in baffle 24 is of sufficient size that is of extremely low impedance at audio frequencies and essentially "transparent" to sound waves so that the combined volumes of the two chambers 14, 16 are configured such that their resonant frequency is at a frequency that both improves the low frequency performance of the loudspeaker system 10 and significantly reduces the noise produced by the fan heard outside the enclosure in a manner described above.

Figure 3:
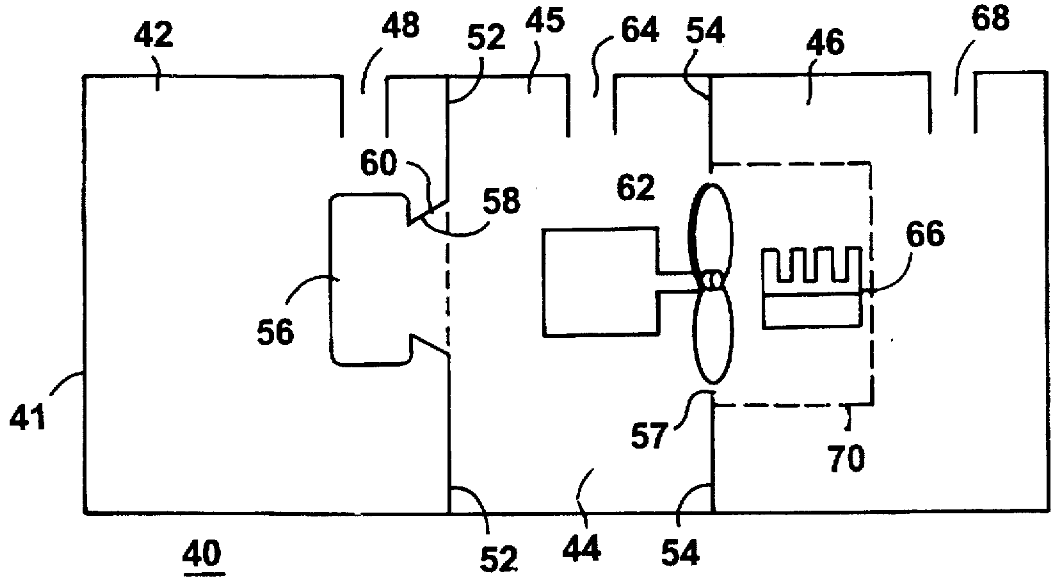
FIG. 3 is a diagrammatic view of a third embodiment of the invention.

Referring to FIG. 3, there is shown another embodiment of the invention. A loudspeaker system 40 includes an enclosure 41 having two chambers, 42, 44. Chamber 44 may have two sections, 45, 46, each having a port, 64, 68, respectively, in an exterior wall. The first chamber 42 and the second chamber 44 are separated by a divider 52; the sections 45, 46, may be separated by a baffle 54. An electroacoustical transducer 56 is positioned in divider 52 with one side of the radiating surface (in this embodiment, the front side 58) facing into the second chamber 44 and another side of the radiating surface (in this embodiment, the back side 60 facing into the first chamber 42. In an opening 57 in baffle 54 is a fan 62 which draws air into the first section 45 through port 64 and across heat producing device 66, thereby cooling the heat producing device. The cooling air exhausts through port 68 in the second section 46. The heat producing device may be placed in a ventilated enclosure 70.

The opening 57 in the second baffle 54 is large enough to be of extremely low impedance at audio frequencies, so the second baffle 54 is essentially "transparent" to sound waves, and the combined volume of the second and third chambers 44, 46 presents a single acoustic compliance. The combined volume of the second and third chambers 44, 46 and the dimensions of the two ports 64, 68 are configured such that they function acoustically in a manner similar to one of the chambers **16*a*, 16*b*** of U.S. Pat. No. 4,549,631, and the loudspeaker system is acoustically equivalent to the loudspeaker system shown in FIG. 1 of the above referenced U.S. patent and described in the accompanying disclosure.

Additionally, the portion of enclosure 41 including the second and third chambers 44, 46, and the ports 64, 68 functions similarly to the embodiments of FIGS. 1 and 2 to attenuate the noise produced by fan 62.

The elements of the embodiment of FIG. 3 can be arranged in other configurations while still performing the same function as the embodiment of FIG. 3. For example, the electroacoustical transducer 56 can face into the first chamber 42, the fan 62 can draw air through port 68 in the second section 46, and exhaust the air through port 64 in the first section 45, or the heat producing device can be placed in the first section 45.

A loudspeaker system according to FIG. 3 is advantageous, because it permits a single enclosure to enhance loudspeaker performance, enclose heat producing electronic components and devices for cooling the electronic components, and reduce undesirable noise heard outside the enclosure produced by the cooling devices. A loudspeaker system according to FIG. 3 is particularly advantageous for use in high performance multimedia computers providing high quality sound and housing components such as power supplies that generate significant heat.

In one embodiment, the dimensions of port 64, 68 and volumes of second and third chambers 44, 46, are configured to resonate at a frequency of approximately 45 Hz and fan 56 produces noise having frequencies predominantly above 100 Hz.

Figure 4:
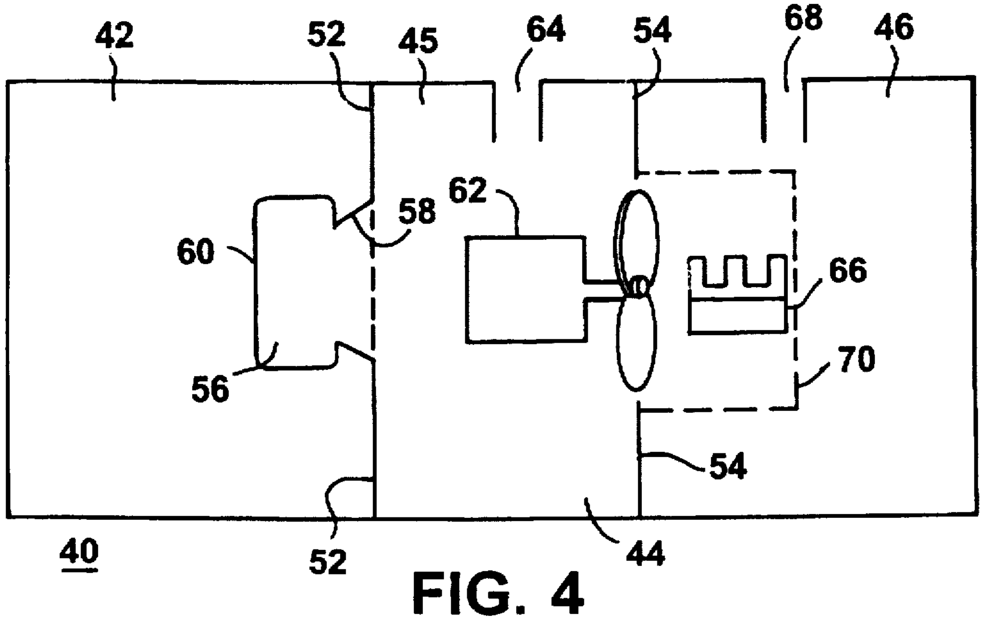
FIG. 4 is a diagrammatic view of a fourth embodiment of the invention.

Referring to FIG. 4, there is shown an alternate embodiment of the invention. The elements of FIG. 4 are similar to the elements of FIG. 3, except that the first port 48 (of FIG. 3) is not present, so that the first chamber 42 is sealed. The cooling of electronic component 66 and the attenuation of noise produced by fan 62 are preformed in a manner similar to the embodiment of FIG. 3. As with the embodiment of FIG. 2, for acoustic purposes, the combined volumes of second and third subchambers 44, 46 have an acoustical compliance equivalent to a single chamber with the same volume. The dimension of ports 64, 68 in the second and third subchambers can be selected such that the embodiment of FIG. 4 is equivalent acoustically to a multi-chamber, single ported sealed chamber loudspeaker, familiar to those in the acoustic art. Additionally, the portion of enclosure 41 including the second and third subchambers 44, 46, and ports 64, 68 functions similarly to the embodiment of FIG. 1 to attenuate the noise produced by fan 62, and the embodiment of FIG. 4 has the same advantages as the embodiment of FIG. 3.

Figure 5:
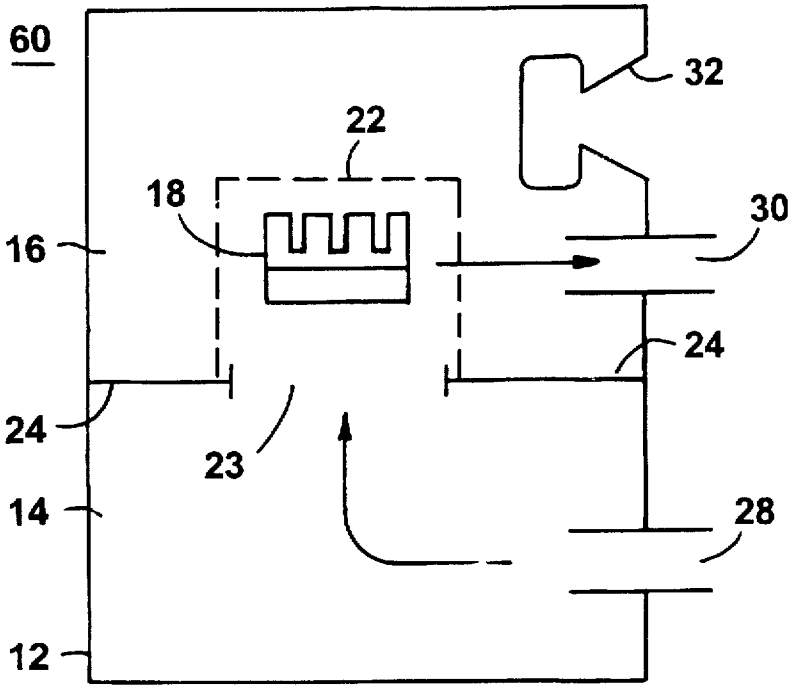
FIG. 5 is a diagrammatic view of a fifth embodiment of the invention.

Referring to FIG. 5, there is shown yet another embodiment of the invention. The embodiment of FIG. 5 has the elements of FIG. 2, except for the fan 20, and functions in an acoustically similar manner to improve performance of loudspeaker system 60. In this embodiment, a convective airflow enters first port 28, passes over the heat producing device 18, and exits through second port 30.

For purposes of clarity, the embodiments have been shown with rectangular enclosures. However, the invention can also be implemented with enclosures of many different shapes. Additionally, the techniques disclosed herein may be applied to any ported loudspeaker system regardless of the number of volumes and the number and placement of ports. A baffle having low acoustic impedance at audio frequencies and designed and constructed to direct airflow across a desired location can be placed in a loudspeaker chamber, and a port can be replaced by two or more ports having an equivalent combined acoustic mass.

Other embodiments are within the claims.

What is claimed is:

1. Noise attenuation apparatus, comprising:

an enclosure having a wall separating an interior and an exterior, said interior characterized by an acoustic compliance, a device producing noise, said device being disposed in said interior of said enclosure, said noise having spectral components predominantly in a noise frequency range, a first port having a first acoustic mass, said port passing through said wall between said interior and said exterior, wherein said acoustic compliance and said first acoustic mass are configured to establish a resonant frequency outside said noise frequency range, said port and said acoustic compliance constructed and arranged to act as a filter that allows direct current air flow to pass freely through said port between said interior and said exterior while reducing the noise produced by said device that passes through said port to said exterior heard outside the enclosure.

2. Noise attenuation apparatus in accordance with claim 1, and further comprising, a heat producing device disposed in said enclosure wherein said noise producing device comprises a fan for causing air to flow across said heat producing device.

3. Noise attenuation apparatus in accordance with claim 2, and further comprising, a second port, said second port having a second acoustic mass, wherein said acoustic compliance and said first and second acoustic masses are configured to establish said resonant frequency.

4. Noise attenuation apparatus in accordance with claim 3, and further comprising, a baffle for directing a flow of said air across said heat producing device, and wherein said fan is arranged so as to cause an airflow in said first port, across said heat producing device, and out said second port.

5. Noise attenuation apparatus in accordance with claim 1, and further comprising, a heat producing device disposed in said enclosure, and a baffle for directing an airflow across said heat producing device.

6. Noise attenuation apparatus in accordance with claim 1, and further comprising, an electroacoustical transducer mounted in said wall of said enclosure.

7. Noise attenuation apparatus in accordance with claim 1, and further comprising, a divider dividing said enclosure into first and second subchambers, and an electroacoustical transducer mounted in said divider.

8. Noise attenuation apparatus in accordance with claim 1, wherein said resonant frequency is of the order of 45 Hz.

9. A loudspeaker system comprising:

a first chamber, defined by a wall, enclosing a volume characterized by acoustic compliance, first and second ports protruding through said wall, an electroacoustical transducer mounted in said wall, a heat-producing device disposed in said first chamber, a flow director producing noise and directing a cooling air flow through said first port across said heat-producing device and out said second port, said ports and said acoustic compliance constructed and arranged to act as a filter that allows direct current air flow to pass freely through said ports while reducing said noise that passes through said ports heard outside the volume.

10. A loudspeaker system in accordance with claim 9, wherein said flow director comprises a fan, said fan generating noise having spectral components predominantly within a noise frequency range, wherein said volume and said first and second ports are configured to resonate at a frequency outside said noise frequency range.

11. A loudspeaker system in accordance with claim 10, and further comprising, a baffle for coacting with said fan to direct said airflow over said heat producing device.

12. A loudspeaker system comprising, a first chamber, defined by a wall, enclosing a volume characterized by acoustic compliance, first and second ports protruding through said wall, an electroacoustical transducer a heat producing device disposed in said first chamber, a flow director directing a cooling airflow through said first port across said heat producing device and out said second port, said flow director generating noise having spectral components predominantly within a noise frequency range, wherein said volume and said first and second ports are configured to resonate at a frequency outside said noise frequency range, a second chamber separated from said first chamber by a divider, wherein said transducer is mounted in said divider, with a front of said transducer facing one of said first chamber and said second chamber, and a back of said transducer facing the other of said first chamber and said second chamber.

13. A loudspeaker system comprising, a wall defining an enclosure, said enclosure having an interior of predetermined volume and characterized by acoustic compliance, a first port through said wall, a second port through said wall, and an electroacoustical transducer mounted in said wall, wherein said volume, said first port and said second port are configured to have a resonant frequency that improves acoustical performance of said loudspeaker system, and a heat-producing device disposed in said interior, wherein said first port and said second port are configured so that an air flow may enter said first port, flow across said heat-producing device and exit through said second port, said ports and said acoustic compliance constructed and arranged to act as a filter that allows direct current air flow to pass freely through said ports while reducing any noise spectral components below said resonant frequency that passes through said ports heard outside the enclosure.

14. A loudspeaker system in accordance with claim 13, and further comprising, a fan disposed in said enclosure for causing said airflow, said fan producing noise having spectral components predominantly in a noise frequency band, wherein said resonant frequency has a value outside said noise frequency band.

15. A loudspeaker system comprising, a wall defining an enclosure, said enclosure having an interior of predetermined volume and characterized by acoustic compliance, a first port through said wall, a second port through said wall, and an electroacoustical transducer, wherein said volume, said first port and said second port are configured to have a resonant frequency that improves acoustical performance of said loudspeaker system, and a heat-producing device disposed in said interior, wherein said first port and said second port are configured so that an air flow may enter said first port, flow across said heat-producing device and exit through said second port, said ports and said acoustic compliance constructed and arranged to act as a filter that allows direct current air flow to pass freely through said ports while reducing any noise spectral components below said resonant frequency that passes through said ports heard outside the enclosure, a fan disposed in said enclosure for causing said airflow, said fan producing noise having spectral components predominantly in a noise frequency band, wherein said resonant frequency has a value outside said noise frequency band, a divider for dividing said interior of said enclosure into chambers, said electroacoustical transducer being mounted in said divider.

* * * * *